United States Patent [19]

Sakamoto et al.

[11] Patent Number: 4,987,002
[45] Date of Patent: Jan. 22, 1991

[54] PROCESS FOR FORMING A CRYSTALLINE DIAMOND FILM

[75] Inventors: Masakatu Sakamoto, Hachiohji; Youichi Yaguchi, Tokyo; Hiroaki Toshima, Ibaragi; Toshiroh Kotaki, Tokyo, all of Japan

[73] Assignees: Kabushiki Kaisha Kenwood; Namiki Precision Jewel Co., Ltd., both of Tokyo, Japan

[21] Appl. No.: 347,027

[22] Filed: May 4, 1989

[30] Foreign Application Priority Data

May 9, 1988 [JP] Japan .................. 63-110510

[51] Int. Cl.$^5$ .................. B05D 1/08; C23C 16/00
[52] U.S. Cl. .................. 427/34; 427/249; 264/81
[58] Field of Search .................. 181/167, 170; 264/81; 423/446, 449, 452, 454; 427/249, 34, 38, 39, 398.1, 398.2; 428/408; 501/86

[56] References Cited

U.S. PATENT DOCUMENTS

| 4,115,721 | 9/1978 | Friz .................. 29/600 X |
| 4,470,479 | 9/1984 | Inoue et al. .................. 181/170 X |
| 4,725,345 | 2/1988 | Sakamoto et al. .................. 204/192.11 X |
| 4,767,608 | 8/1988 | Matsumoto et al. .................. 427/113 X |
| 4,769,094 | 9/1988 | Park et al. .................. 420/442 X |
| 4,772,395 | 9/1988 | Tungatt et al. .................. 210/506 OR |
| 4,870,672 | 9/1989 | Lindberg .................. 427/126.3 X |

OTHER PUBLICATIONS

K. Kurihara et al.,"Growth of Diamond by DC Plasma Jet CVD", Electronic Materials, pp. 49–54.

*Primary Examiner*—James Lowe
*Assistant Examiner*—Christopher A. Fiorilla
*Attorney, Agent, or Firm*—Sixbey, Friedman, Leedom & Ferguson

[57] ABSTRACT

A crystalline diamond film is formed on a thin substrate. Energy is applied by a thermal plasma torch to a gas mixture to deposit carbon particles onto the substrate. The substrate is positioned on a pedestal with a cooling facility in which an intermediate layer of thermally conductive powder is interposed between the substrate and the pedestal.

17 Claims, 9 Drawing Sheets

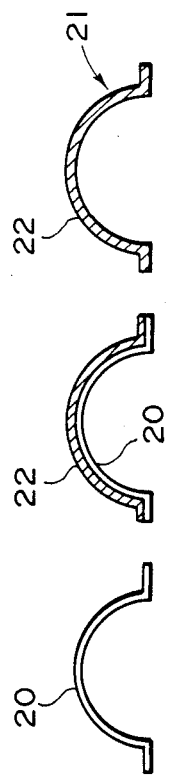
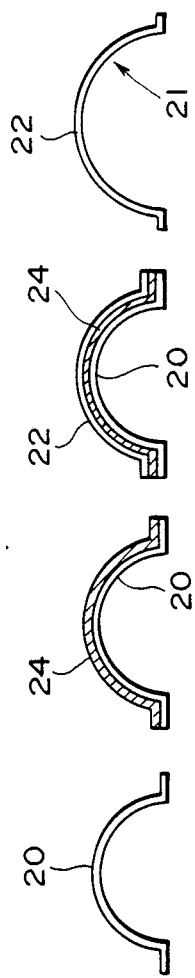

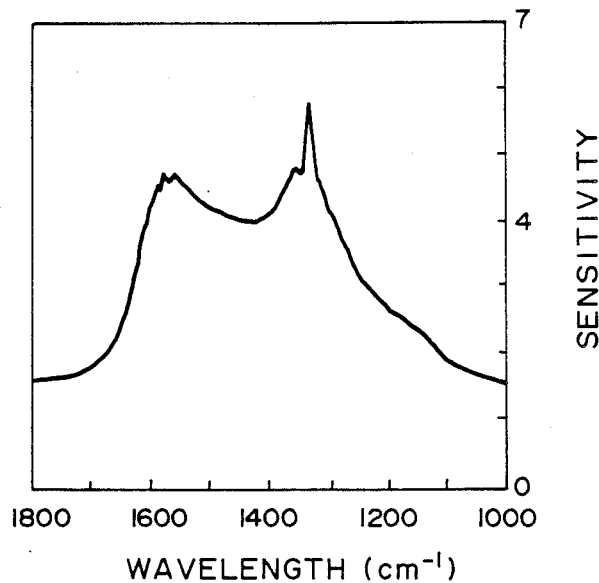
F I G. 8
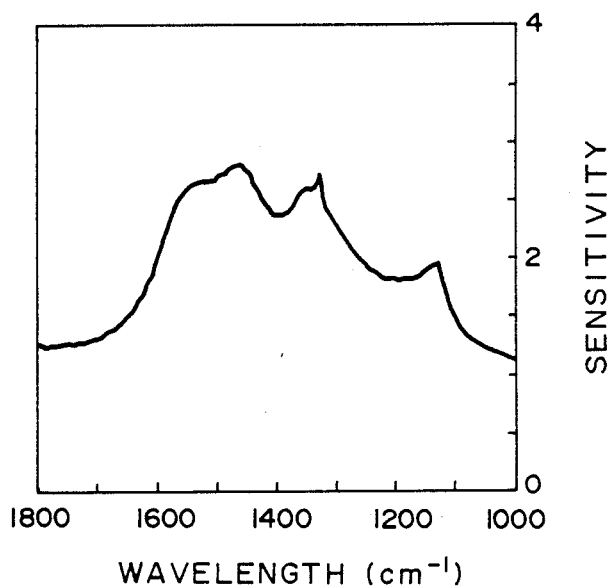
F I G. 9

PROCESS FOR FORMING A CRYSTALLINE DIAMOND FILM

BACKGROUND OF THE INVENTION

1. Field of the Invention

The present invention relates to an acoustic diaphragm and a method of manufacturing the same.

2. Description of Related Art

Various materials of acoustic diaphragms and methods of processing the surface of diaphragm base member have been proposed heretofore, particularly for loudspeakers for high and middle frequency use. Among such methods, as a method of forming a diamond film with less amorphism on the surface of a diaphragm base member, there are known a thermal filament method, electron impact CVD (EACVD) method, a microwave CVD (MCVD) method, a plasma jet method, a DC plasma method and the like.

There is also known a method of forming a diaphragm made of only a diamond film as disclosed Japanese Patent Laid-Open Gazette No. 61-128700. According to this method, a diamond film is deposited on a monocrystal silicon formed in the shape of diaphragm by an MCVD method using a 2.45 GHz microwave while emitting a plasma of a mixture gas composed of methane ($CH_4$) and hydrogen ($H_2$) and thereafter the monocrystal silicon is dissolved to obtain a diamond diaphragm.

Conventional acoustic diaphragms and manufacturing methods are associated with the following problems.

First, with the thermal filament and EACVD methods, the area of a deposited film is small, the distance to a diaphragm base material on which a film is deposited is short, and the distribution of film thickness is poor. Also as to the MCVD method, it is known that the deposition area is determined by the dimension of a silica glass tube reacting with a waveguide and the dimension of a plasma. With any one of the above conventional methods, the diameter of a deposition area is only 3 to 10 cm so that the manufacturing capability is limited about one to five diaphragms having a diameter of one inch. Further, the film deposition thickness per hour is 1 to 10 microns/$cm^2$, resulting in high cost and poor mass productivity.

Second, since the above conventional methods form a diamond film through heating a filament, DC discharge, high frequency microwave discharge, a diaphragm base material is heated up to about 1000 degrees centigrade, resulting in deformation or damage of the base material. Thus, it is necessary to realize improved heat dissipation.

Third, with the method of manufacturing a diaphragm made of only a diamond film as disclosed in the above-described Japanese Patent Laid-Open Gazette No 61-128700, it is difficult to form a monocrystal silicon having a desired shape. The diameter of a deposited area is only 3 to 10 cm. In addition, since the deposition film thickness per hour is equal to or smaller than 1 micron/$cm^2$, it takes several tens hours to manufacture a diaphragm having a diamond film thickness of several tens microns, leaving a problem of mass productivity.

SUMMARY OF THE INVENTION

It is therefore a first object of the present invention to provide an acoustic diaphragm having a diamond film formed on the surface of a diaphragm base member, wherein a uniform diamond film thickness is ensured even for large diameter diaphragms It is a second object of the present invention to provide a method of manufacturing an acoustic diaphragm, wherein a diamond film can be formed reliably and in short time on the surface of a diaphragm base member, with excellent mass productivity and no limit of dimension of a diaphragm.

It is a third object of the present invention to provide a method of manufacturing an acoustic diaphragm made of only a diamond film, capable of manufacturing an acoustic diaphragm in short time, with excellent mass productivity and no limit of dimension of a diaphragm.

The above objects of the present invention can be achieved by providing an acoustic diaphragm comprising a crystalline diamond film formed on at least one side of a ceramic diaphragm base member formed in the shape of diaphragm, the crystalline diamond film being formed by emitting a thermal plasma of a mixture gas composed of argon, hydrocarbon and hydrogen.

The diaphragm base member may be a carbide-based ceramic including silicon carbide, an oxide-based ceramic including alumina and zirconia, or a nitride-based ceramic including titanium nitride and boron nitride.

The diaphragm base material may also be metallic diaphragm base member. The metallic diaphragm base member may be made of titanium, and wherein there is formed a titanium carbide layer on the surface of the metallic diaphragm base member by emitting a thermal plasma of a mixture gas composed of argon and hydrocarbon, and there is formed a crystalline diamond film on the titanium carbide layer by emitting a thermal plasma of a mixture gas composed of argon, hydrocarbon and hydrogen, whereby the acoustic diaphragm has a three-layered raw material including titanium, titanium carbide and diamond.

According to the method of manufacturing an acoustic diaphragm of this invention, a method of manufacturing an acoustic diaphragm made of only a diamond film by forming said diamond film on the surface of a metallic base member formed in the shape of diaphragm, and thereafter by dissolving said metallic base member, comprises the steps of depositing a crystalline diamond film on the metallic base member made of titanium, tantalum or molybdenum and formed in the shape of diaphragm, by emitting a thermal plasma of a mixture gas composed of argon, hydrocarbon and hydrogen; and dissolving the metallic base member.

Silicon or titanium carbide may be vapor deposited on the surface of the metallic base member to form thereon a diamond film, and thereafter the metallic base member is dissolved.

In a method of manufacturing an acoustic diaphragm by forming a diamond film on a diaphragm base member, ceramic powders are filled between the diaphragm base member and a heat radiator on which the diaphragm base member is mounted, and while cooling the diaphragm base member, a crystalline diamond film is formed on the diaphragm base member by emitting a high temperature plasma of a mixture gas composed of argon, hydrocarbon and hydrogen.

The ceramic powders to be filled may be ceramics made of diamond, cubic boron nitride and silicon carbide.

Another method may also be used wherein the diaphragm base member is mounted on a heat radiator having a mount portion formed in the shape corresponding to the diaphragm base member, and while water-cooling the heat radiator, a crystalline diamond film is formed on the diaphragm base member by emitting a high temperature plasma of a mixture gas composed of argon, hydrocarbon and hydrogen.

Diamond, cubic boron nitride and silicon carbide may be vapor deposited on the surface of the mount portion of the heat radiator to form thereon a ceramic film for further enhancing the cooling effect of the diaphragm base member.

Of various types of acoustic diaphragms according to this invention, a diaphragm having a crystalline diamond film formed on a diaphragm base member has an excellent sound velocity as described later. Further, spurious partition vibrations are reduced because of high hardness and high rigidity specific to diamond, thus realizing a diaphragm of excellent performance.

A diaphragm formed only by a crystalline diamond film has a uniform film thickness with excellent sound velocity.

In the method of manufacturing an acoustic diaphragm according to the present invention, a thermal CVD method is used for supplying a great amount of mixture gas in forming a diamond film on the base member, the mixture gas being composed of argon, hydrocarbon and hydrogen. According to this method, a high temperature plasma can be generated. In addition, electrodes for DC discharge are mounted within a plasma torch so that a distance to a base member on which a film is formed is set freely. Further, a number of base materials can be processed while moving them around the plasma torch. The film deposition rate per time itself is also excellent. Therefore, a crystalline diamond film having a uniform thickness can be formed on the base member in short time without any limit of the dimension of the base material on which a film is formed.

Accordingly, a crystalline diamond diaphragm having a desired thickness may be mass produced by the method of manufacturing a diaphragm made of only a diamond film by dissolving a metallic base member having a diamond film formed thereon.

The thermal CVD method generates a high temperature plasma as described previously. Therefore, there is a possibility that a diaphragm base member may be melted or deformed considerably, or carbonization thereof may be quickened. However, this can be overcome by forming a crystalline diamond film while cooling the diaphragm base member.

BRIEF DESCRIPTION OF THE DRAWINGS

The above and other objects and features of the present invention will become more apparent from the following description when read in conjunction with the accompanying drawings, in which:

FIGS. 1 to 13 show the embodiments of an acoustic diaphragm and the method of manufacturing the same according to the present invention;

FIG. 1 shows the system arrangement used with the thermal plasma CVD method;

FIG. 2 is a temperature distribution graph of a plasma jet;

FIGS. 7A and 7B show base members and diamond films during the manufacturing processes for an acoustic diaphragm made of only a diamond film;

FIGS. 8, 9, 10A and 10B show Raman spectral characteristics; and

FIGS. 11 to 13 show the frequency characteristics of loudspeakers equipped with acoustic diaphragms.

DETAILED DESCRIPTION OF THE PREFERRED EMBODIMENTS

The embodiments of an acoustic diaphragm and a method of manufacturing the same according to the present invention will be described with reference to FIGS. 1 to 13.

Figure 1:
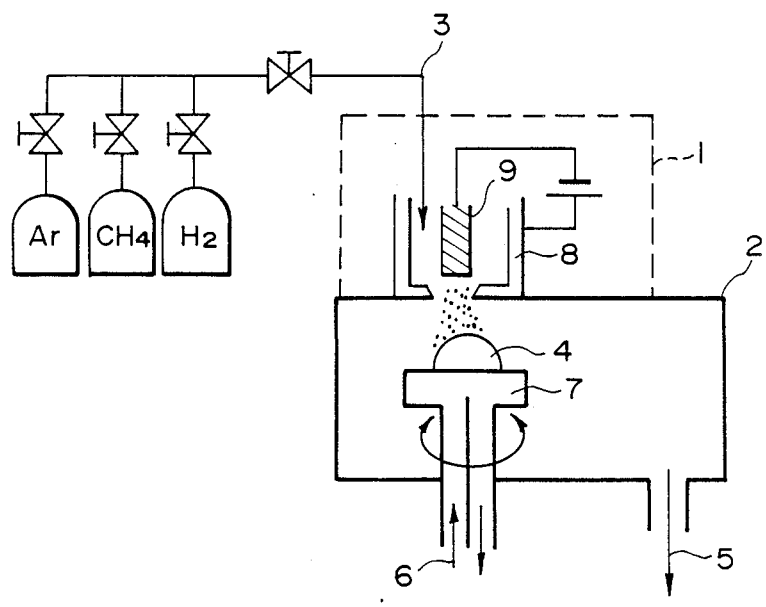

FIG. 1 shows the system arrangement used with the thermal plasma CVD method. A plasma torch (gun) 1 for generating a thermal plasma and a chamber 2 is maintained vacuum by discharging air 5. A raw material gas 3 is supplied within the plasma torch 1. In this embodiment, a diaphragm base member 4 on which a film is formed, is shaped in a dome configuration and mounted on a heat radiator 7 within which cooling water 6 circulates. The heat radiator 7 is adapted to rotate.

The plasma torch 1 emits a plasma made of methane and hydrogen decomposed from hydrocarbon upon DC discharge between an anode electrode 8 and cathode electrode 9. A diamond film of crystalline grains is formed on the diaphragm base member by a CVD method.

With the above method, it becomes possible to supply a great amount of mixture gas to the plasma torch 1 and generate a high temperature plasma. Since the electrodes for DC discharge are mounted within the plasma torch, the distance to the diaphragm 4 on which a film is formed can be set freely. A great number of diaphragms 4 can be processed while moving them around the plasma torch. Such advantages have not been realized with conventional methods. Further, according to this thermal plasma CVD method, a great amount of gas is supplied in forming a diamond film so that the deposition rate about 10 to 50 times as great as conventional can be obtained, which is suitable for mass production.

Figure 2:
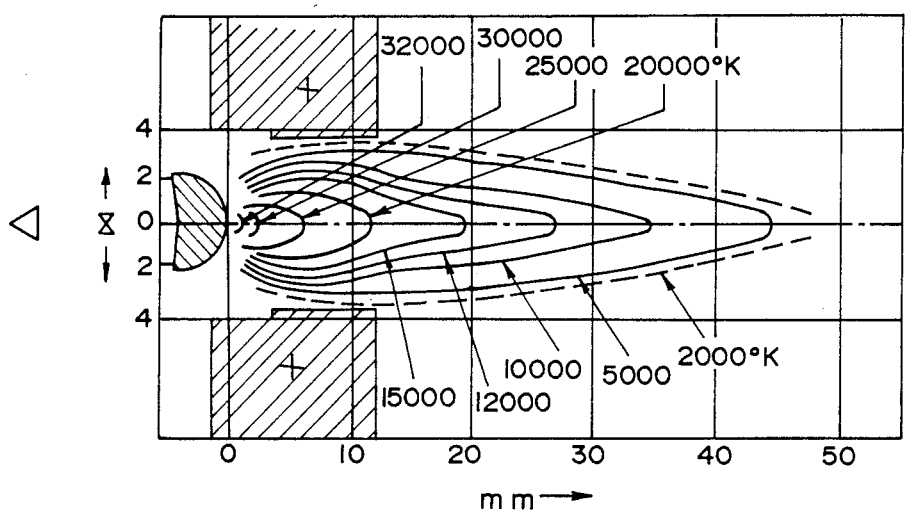

FIG. 2 is a temperature distribution graph of a plasma jet obtained by the thermal plasma CVD method. Since an arc column is squeezed by a magnetic field induced by an arc discharge current, the temperature of the plasma becomes about 10000 to 20000 degrees centigrade at the outlet of the plasma torch 1. It is necessary therefore to efficiently cool the diaphragm 4 mounted on the heat radiator 7 because it is exposed to such high temperature.

In the experiments, the mixture rate of supplied raw material gasses (mixture gas) was
 Argon : 100%
 Methane : 0.1%
 Hydrogen : 7%
The other conditions were:
 Vacuum degree : 20 Torr
 Diaphragm base member : silicon carbide (SiC) 40 microns vapor deposition
 Dimension of base member : 2.5 cm In the experiments, a diaphragm base member of a dome shape was mounted on a conventional support device with a flat support plane, and a thermal plasma was emitted without cooling the diaphragm base member. According to the experiment results, the surface temperature of the diaphragm rose to about 2000 to 3000 degrees centigrade, resulting in melting and considerable deformation of the diaphragm base member. In addition, carbonization was quickened due to high temperature. There was not formed a diamond film.

In consideration of the above, the heat radiator as shown in FIGS. 3A, 3B, 4A and 4B is provided.

The heat radiator 7 made of copper is provided with a fixing jig 10 for fixing the hinge portion of the diaphragm base member 4. Cooling water 6 circulates through an inner water passage 11 to cool the diaphragm base member 4. In the example shown in FIG. 3A, there is formed a mount portion 12 of semi-sphere having a diameter slightly smaller than the dome diameter of the diaphragm base member 4. The diaphragm base member 4 is mounted on the mount portion 12, with ceramic powders being filled between the diaphragm base member 4 and the mount portion 12.

Figure 3A:
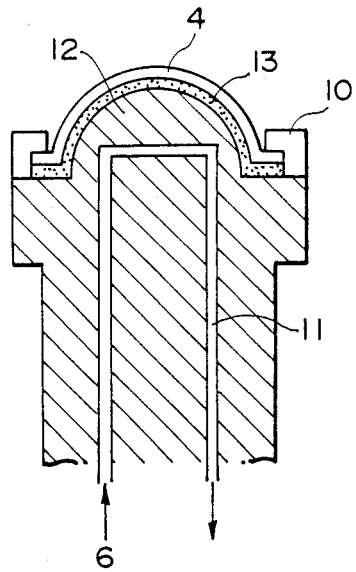
FIGS. 3A, 3B, 4A and 4B are cross sections of heat radiators.

Upon emission of a thermal plasma while cooling the diaphragm base member by the cooling means shown in FIG. 3A, the surface temperature of the diaphragm base member was maintained about 800 to 1000 degrees centigrade.

Figure 3B:
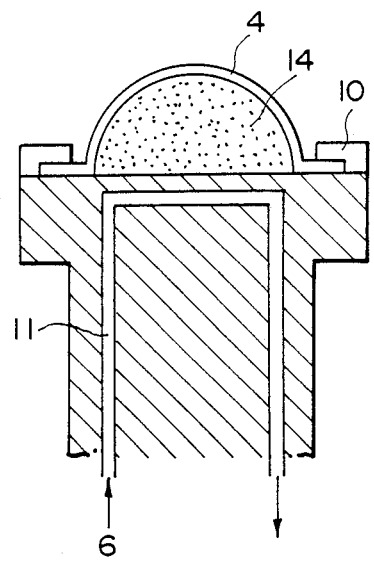

In the example shown in FIG. 3B, the diaphragm base member 4 of a dome shape is mounted on the heat radiator having a flat mount plane, with ceramic powders 14 being filled between the mount plane and the diaphragm base member. The ceramic powders are made of powers of diamond, cubic boron nitride (CBN) and silicon carbide (SiC). It is preferable that any of these powders has a melting point in excess of 1500 degree centigrade and the thermal conductivity is equal to or greater than that of copper used as the heat radiator 7. The thermal conductivity of these materials are:

Copper : 3.85 W/cm×° C.
Diamond : 20.0
Cubic boron nitride : 6.0
Silicon carbide : 2.7
Grain diameter of ceramic : 0.5 to 2 microns The cooling means shown in FIG. 3B could also maintain the surface temperature of the diaphragm base member at about 800 to 1000 degrees centigrade, similar in the case shown in FIG. 3A.

By cooling the diaphragm base member with the cooling means shown in FIGS. 3A and 3B, the surface temperature of the diaphragm base member could be cooled down by one third to one fourth of that without cooling. Thus, the heat resistance at the surface of the heat radiator can be improved so that there occurs no deformation due to thermal melting of the diaphragm base member, and no quality degradation of a diamond film to be caused by gas generation.

Figure 4A:
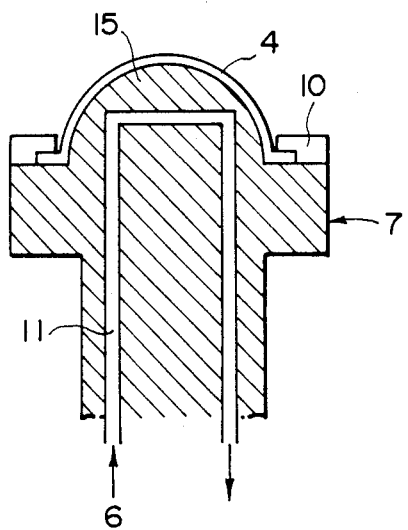

In the example shown in FIG. 4A, a heat radiator 7 is formed with a mount portion 15 of a semi-sphere shape corresponding to the dome shape of the diaphragm base member 4. The diaphragm base member 4 is fittingly mounted on the mount portion 15 for the purpose of water-cooling. This cooling means could also maintain the surface temperature of the diaphragm base member at 800 to 1000 degrees centigrade.

Figure 4B:
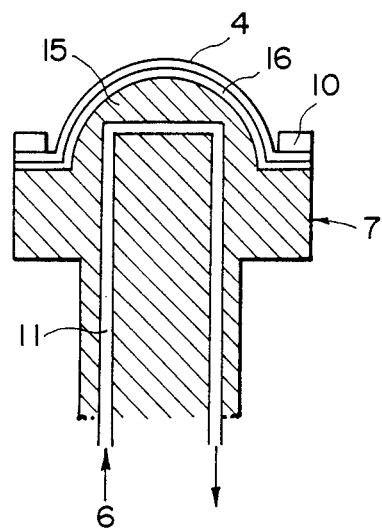

In the example shown in FIG. 4B, there is formed on the surface of a mount portion 15 a ceramic film 16 of 2 to 4 microns thickness made of diamond, cubic boron nitride and silicon carbide by means of the thermal plasma CVD method. The diaphragm base member 4 is therefore mounted on the mount portion 15 with the ceramic film 16 interposed therebetween. This cooling means could also maintain the surface temperature of the diaphragm base member down at 800 to 1000 degrees centigrade.

Next, the embodiments of this invention will be described. The mixture ratio of supplied raw material gasses (mixture gas) are the same as that used for the above-described experiment, as in the following Argon : 100%
Methane : 0.1%
Hydrogen : 7%

The other conditions are:

1st Embodiment

Vacuum degree : 20 Torr

Diaphragm base member : silicon carbide (SiC) 40 microns vapor deposition

Surface temperature of base member : 800 to 1000 degrees centigrade

Dimension of base member : 2.5 cm

Thickness of formed diamond film : 2 microns

The film deposition thickness per hour was 50 to 100 micron/cm$^2$ in the first embodiment.

Figure 5A:
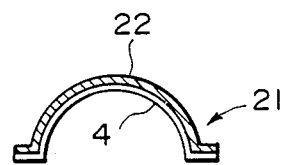
FIGS. 5A to 5C, 6A and 6B are cross sections of acoustic diaphragms.

A dome shaped diaphragm 21 obtained in the first embodiment is shown in FIG. 5A. A crystalline diamond film 22 is formed on the diaphragm base member 4. The analysis of the diamond film 22 was conducted by Raman spectroscopy and S-ray diffraction. The results showed that the obtained diamond film had a peak at 1333 cm$^{-1}$ specific to diamond as shown in the Raman spectral characteristics of FIG. 8 and had a diffraction specific to diamond.

In the first embodiment, the diaphragm base member 4 may use the oxide-based or nitride-based ceramic which has a low density, high elasticity, and a sound velocity of 10000 m/s or higher. Dome shaped diaphragms manufactured by using such ceramic are shown in FIGS. 5B and 5C.

Figure 5B:
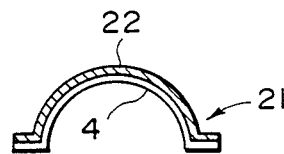
Figure 5C:
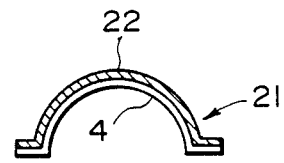

The sound velocities of these dome-shaped diaphragms 21 were 10000 to 12000 m/s for that shown in FIG. 5A, 9000 to 11000 m/s for FIG. 5B, and 8000 to 10000 m/s for FIG. 5C. Therefore, loudspeakers can be realized which are capable of reproducing a high frequency signal about 1.6 to 2.4 times as high as that of a conventional loudspeaker.

Figure 11:
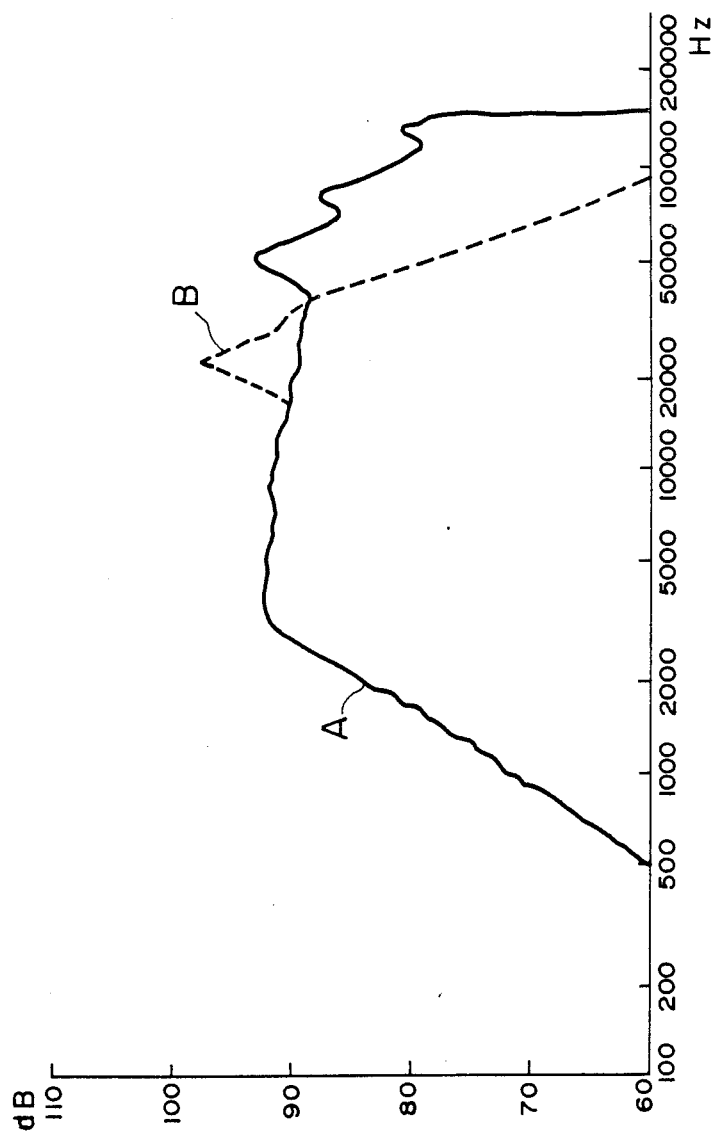

FIG. 11 shows the frequency characteristics A (indicated by a solid line) of the dome shaped diaphragm shown in the first embodiment of FIG. 5A, and the frequency characteristics B (indicated by a broken line) of a dome shaped diaphragm made of only titanium. It is appreciated from the comparison therebetween that the former characteristics A is considerably improved at high frequency.

2nd Embodiment

Different from the first embodiment, a metallic base member was used as the diaphragm base member 4. The surface temperature of the base member was 600 to 1000 degrees centigrade, and the other conditions were the same as the first embodiment.

Figure 6A:
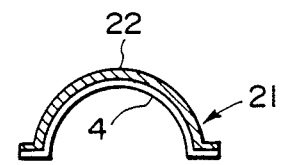

A dome shaped diaphragm 21 obtained in the second embodiment is shown in FIG. 6A. The analysis of a diamond film 22 was conducted in the similar manner as of the first embodiment. As seen from the Raman spectral characteristics of FIG. 9, the film had a peak at 1333 cm$^{-1}$ specific to diamond and a diffraction of diamond, thus the film was identified as being made of diamond.

In the second embodiment, titanium was used as the metallic diaphragm base member 4, a titanium carbide layer was formed on the surface of the metallic diaphragm base member by emitting a high temperature plasma of a mixture gas composed of argon and hydrocarbon, and a crystalline diamond film was formed on the titanium carbide layer by emitting a thermal plasma of a mixture gas composed of argon, hydrocarbon and hydrogen. The obtained dome shaped diaphragm 21 had, as shown in FIG. 6B, a three-layered raw material including a titanium base member 4, titanium carbide layer 23 and diamond film 22.

Figure 6B:
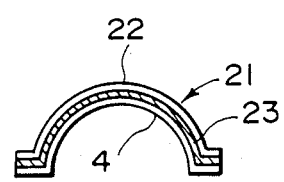

The sound velocities of the dome shaped diaphragms obtained in the second embodiment were 8000 to 10000 m/s for that shown in FIG. 6A, and 9000 to 11000 m/s for FIG. 6B.

Figure 12:
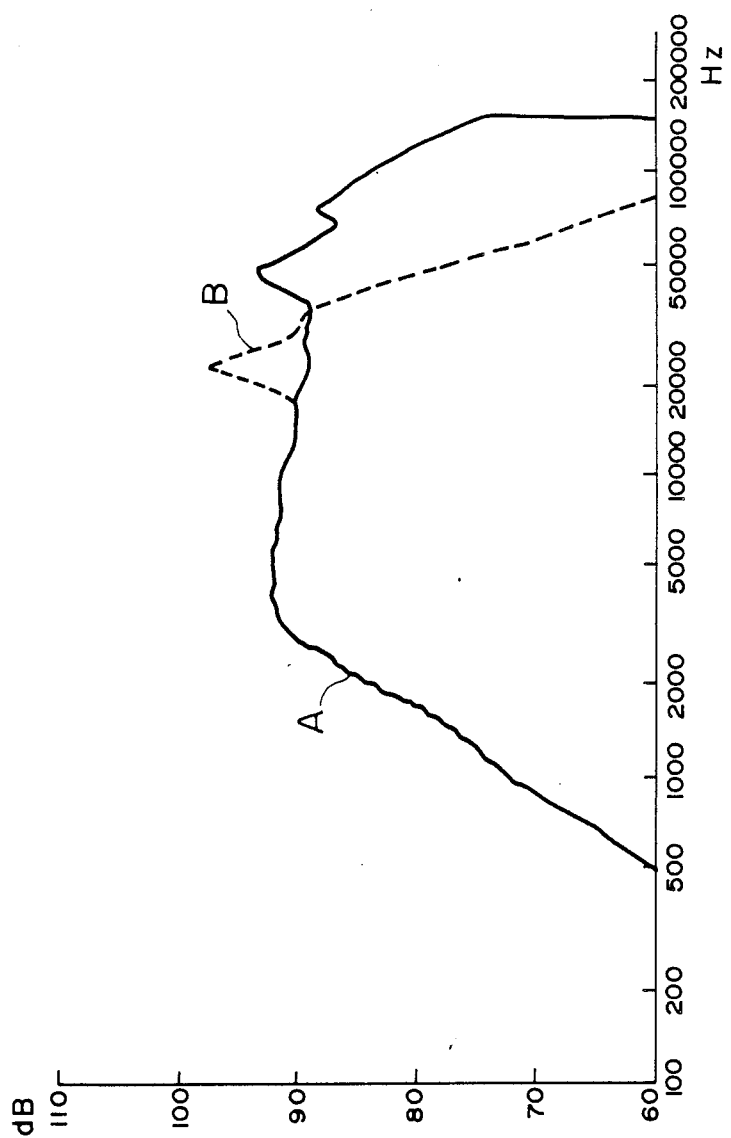
Figure 13:
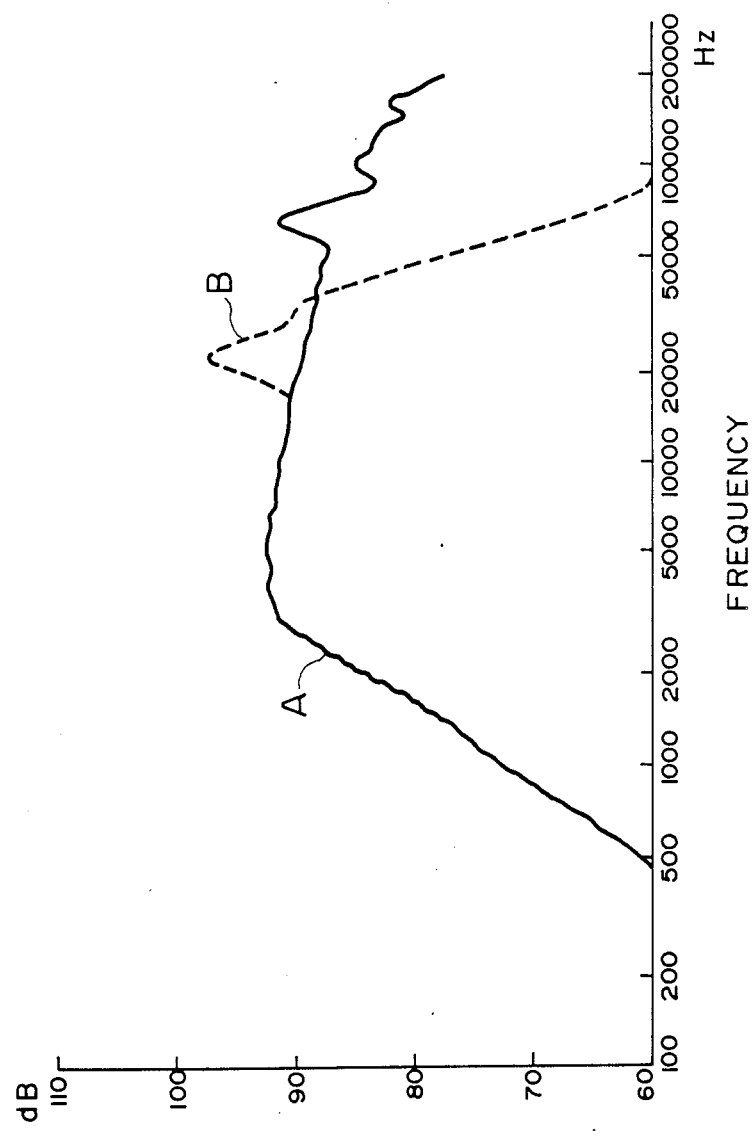

FIG. 12 shows a comparison between the frequency characteristics A of the dome shaped diaphragm in the second embodiment of FIG. 6A and the frequency characteristics B of a dome shaped diaphragm made of only titanium.

3rd Embodiment

Figure 10A:
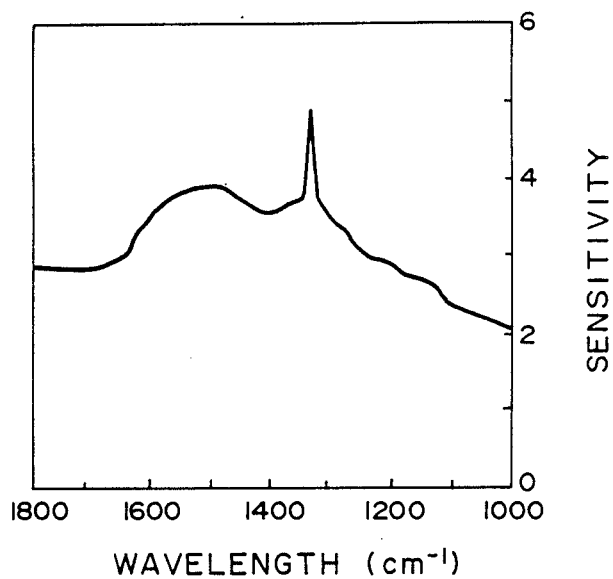
Figure 10B:
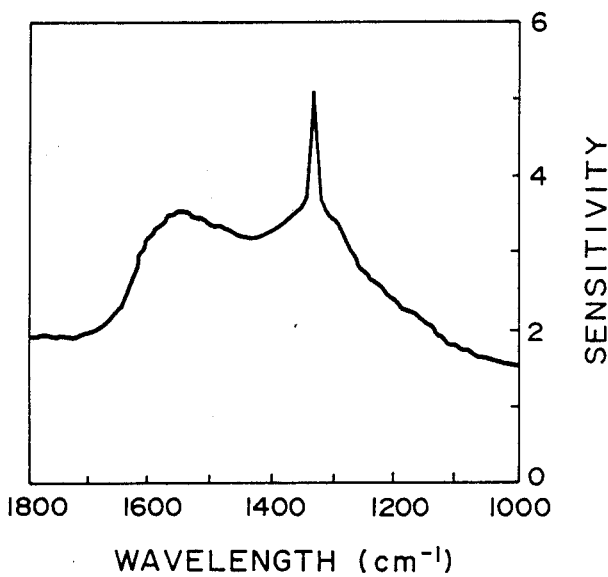

Different from the first embodiment, a metallic base member 20 (FIG. 7A) made of titanium and formed in the dome shape was used its its surface formed with a crystalline diamond film. The conditions were as follows:

Vacuum degree : 100 Torr
Base member : titanium, 30 microns
Surface temperature of base member : 800 to 1000 degrees centigrade
Dimension of base member : 2.5 cm
Deposition time : 45 minutes
Thickness of formed diamond film : 40 microns A crystalline diamond film 22 formed on the metallic base member 20 had a semi-sphere crystal face and had grains of 1 to 5 microns. The Raman spectroscopy and X-ray diffraction were conducted in the similar manner as of the first embodiment. The results showed that a peak at 1333 cm$^{-1}$ specific to diamond was obtained as shown in FIG. 10A and a diffraction of diamond, thus identifying the film as being made of diamond.

The metallic base member 20 having the diamond film 22 formed thereon was dissolved by using a solution of hydrogen fluoride and nitric acid having a mixture ratio of 1:1, to thus obtain the dome shaped diaphragm 21 made of only a diamond film of 40 microns thickness.

In the third embodiment, silicon Si was vapor deposited on the surface of the metallic base member 20 to form a deposited film 24 as shown in FIG. 7B. A diamond film 22 was formed on the deposited film 24. The deposited film 24 of silicon functions to prevent reaction of the diamond film with the metallic base member 20, thus improving the quality of the diamond film 22. The deposited film can be dissolved using the above-described mixture solution. The diamond film 22 thus obtained has crystalline grains of 1 to 5 microns similar to the case described previously, however, it had a crystal face in "100" orientation. The analysis of the diamond film 22 was conducted in the similar manner as above, the Raman spectral characteristics being shown in FIG. 10B.

As shown in FIG. 7B, the metallic base member 20 and deposited film 24 were dissolved in the similar manner as above to obtain the dome shaped diaphragm 21 made of only the diamond film 22.

In the third embodiment, titanium was used as the metallic base member. However, tantalum (Ta) may also be used, or other substances of high melting point such as tungsten and niobium may be used. The deposited film 24 may use silicon carbide. The acoustic constants of the diamond dome shaped diaphragms in the third embodiment of FIGS. 7A and 7B were a density of 3 to 3.4 g/cm$^3$, a Young's modulus of 5.9 to 8.2×10$^{11}$ Pa. The sound velocities were 13000 to 15000 m/s for that shown in FIG. 7A, and 14000 to 16000 m/s for FIG. 7B. Therefore, loudspeakers can be realized which are capable of reproducing a high frequency signal about 2.6 to 3.2 times as high as that of a conventional loudspeaker.

According to an acoustic diaphragm of this invention, excellent acoustic constants can be obtained, and the frequency characteristics at high frequency in particular can be considerably improved so that it is suitable for manufacturing loudspeakers for high and middle frequency use. Further, spurious vibrations are reduced because of high hardness and high rigidity specific to diamond, thus realizing loudspeakers of less distortion.

According to the method of manufacturing an acoustic diaphragm of this invention, a thermal plasma CVD method is used for supplying a great amount of mixture gas in forming a diamond film, and a plasma is emitted while cooling the diaphragm base member. Therefore, a diamond film having a desired film thickness can be formed on the diaphragm base member without melting or deforming it. Further, the film deposition thickness per hour is 10 to 50 times the conventional speed, and a great number of diaphragms of excellent characteristics and low cost can be mass produced while moving them around the plasma torch.

A diamond film having a desired thickness can be formed on the base member in short time so that a diaphragm made of only a diamond film can be mass produced by dissolving a metal base member having the diamond formed thereon. Therefore, the method of this invention is optimum in manufacturing various type of acoustic diaphragms.

Although the present invention has been fully described by way of the preferred embodiments, it is to be noted that various changes and modifications are possible which should be construed as falling in the scope and spirit of this invention as defined by the appended claims.

What is claimed is:

1. A crystalline diamond film forming process comprising the steps of:
   arranging a pedestal cooled with cooling facility during the film forming process;
   positioning a thin substrate on said pedestal with an intermediate layer which is interposed between the pedestal and the substrate, the intermediate layer comprising a thermally conductive powder;
   feeding a mixture of gas composed of argon, a hydrocarbon, and hydrogen to a thermal plasma generating means; and
   applying energy to the gas mixture via said thermal plasma generating means to produce decomposed carbon particles and depositing the carbon particles onto the substrate to form a crystalline diamond film.

2. The process according to claim 1, wherein said energy applying and carbon particle depositing step is implemented by a plasma torch gun for generating a thermal plasma to which the gas mixture is fed.

3. The process according to claim 1, wherein said intermediate layer comprises ceramic powders.

4. The process according to claim 1, wherein the thickness of the substrate is below 40 microns.

5. The process according to claim 1, wherein the substrate is an acoustic diaphragm.

6. The process according to claim 1, wherein the substrate is made of titanium.

7. The process according to claim 1, wherein the temperature on the substrate surface is in the range of 800 to 1000 degrees centigrade.

8. The process according to claim 1, wherein the gas mixture comprises Argon, Methane and Hydrogen, the mixture ratio of which is 100:0.1:7.

9. The process according to claim 1, wherein the material of the thermal conductive powder is selected from the group consisting of diamond, cubic boron nitride and silicon carbide.

10. The process according to claim 1, wherein the material of the thermal conductive powder has a melting point in excess of 1500 degrees centigrade and a thermal conductivity equal to or greater than that of the pedestal.

11. The process according to claim 1, wherein said energy applied to said gas mixture is thermal energy.

12. A crystalline diamond film forming process comprising the steps of:
   arranging a pedestal;
   positioning a thin substrate on said pedestal with an intermediate layer which is interposed between the pedestal and the substrate, the intermediate layer comprising a thermally conductive powder;
   feeding a mixture of gas composed of argon, a hydrocarbon, and hydrogen to a thermal plasma generating means;
   applying energy to the gas mixture via said thermal plasma generating means to produce decomposed carbon particles and depositing the carbon particles onto the substrate to form a crystalline diamond film; and
   cooling said pedestal so that the temperature on the substrate surface is maintained in the rang of 800 to 1000 degrees centigrade.

13. The process according to claim 12, wherein said substrate is made of titanium.

14. The process according to claim 12, wherein said energy applying and carbon particle depositing step is implemented by a plasma torch gun for generating a thermal plasma to which the gas mixture is fed.

15. The process according to claim 12, wherein said substrate is an acoustic diaphragm.

16. The process according to claim 12, wherein said energy applied to said gas mixture is thermal energy.

17. The process according to claim 12, wherein the material of said thermal conductive powder is selected from the group consisitng of diamond, cubic boron nitride and silicon carbide.

* * * * *